Nov. 26, 1968 S. YEE 3,413,488

COMPLEMENTARY COINCIDENCE DETECTOR FOR PRODUCING A GIVEN OUTPUT SIGNAL ONLY WHEN ALL INPUT SIGNALS HAVE THE SAME BINARY VALUE

Filed April 14, 1965

INVENTOR.
SEENING YEE
BY
S. C. Yeaton
ATTORNEY 3,413,488

COMPLEMENTARY COINCIDENCE DETECTOR FOR PRODUCING A GIVEN OUTPUT SIGNAL ONLY WHEN ALL INPUT SIGNALS HAVE THE SAME BINARY VALUE

Seening Yee, Whitestone, N.Y., assignor, by mesne assignments, to the United States of America as represented by the Secretary of the Navy Filed Apr. 14, 1965, Ser. No. 448,002
2 Claims. (Cl. 307—216)

ABSTRACT OF THE DISCLOSURE

A logic circuit employs first and second pairs of serially connected complementary transistors. The two pairs are connected in parallel with each other and to a source of energy through load resistance means. A first input signal drives one transistor in the first pair and the opposite conductivity type transistor in the second pair. A second input signal drives the two remaining transistors. Output signals are taken from the junction between the load resistance means and the transistors.

The invention herein described was made in the course of or under a contract or subcontract thereunder with the Department of the Navy.

This invention relates to logic circuits and more particularly to logic circuits for detecting coincidence between pairs of input pulses.

Basically, the circuit of the invention performs the logic operations $AB+\overline{A}\overline{B}$ and $A\overline{B}+\overline{A}B$.

Circuits for performing these logic operations are known in the prior art. Some of these circuits, however, require the simultaneous application of true and complementary input signals. These circuits thus require some form of inversion means to provide the necesary complementary signals.

Furthermore, the prior art circuits usually provide an output signal that is nonsymmetrical with respect to ground so that a coupling capacitor must be inserted between the logic circuit and the external circuits driven by the logic circuit.

It is an object of the present invention to provide a logic circuit capable of performing an exclusive OR operation simultaneously with a coincidence operation.

It is another object of the present invention to provide a coincidence circuit that does not require complemented input signals.

It is another object of the present invention to provide a coincidence circuit having an output waveform of increased amplitude.

It is yet another object of the present invention to provide a coincidence circuit having an output waveform that is symmetrical about the zero voltage axis.

It is still another object of the present invention to provide a coincidence circuit employing a minimum number of circuit elements.

The principles in operation of the invention may be understood by referring to the following description and the accompanying drawings.

Figure 1:
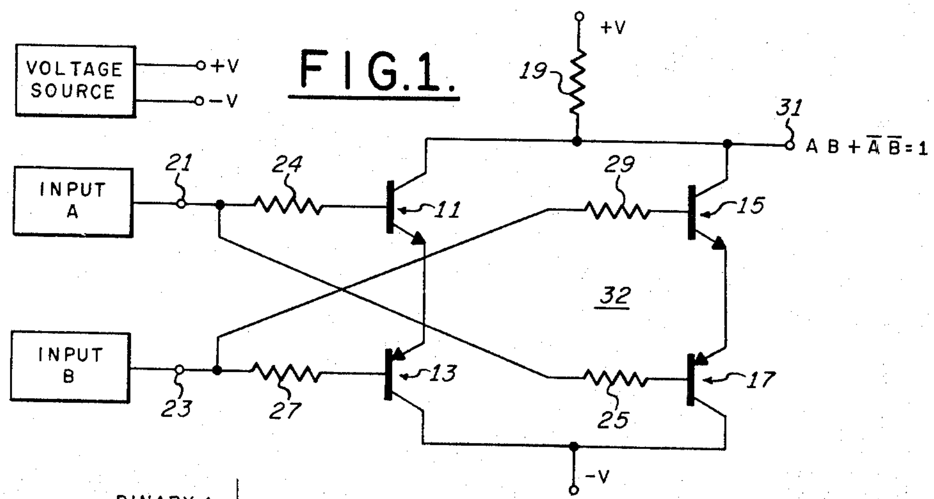
Figure 2:
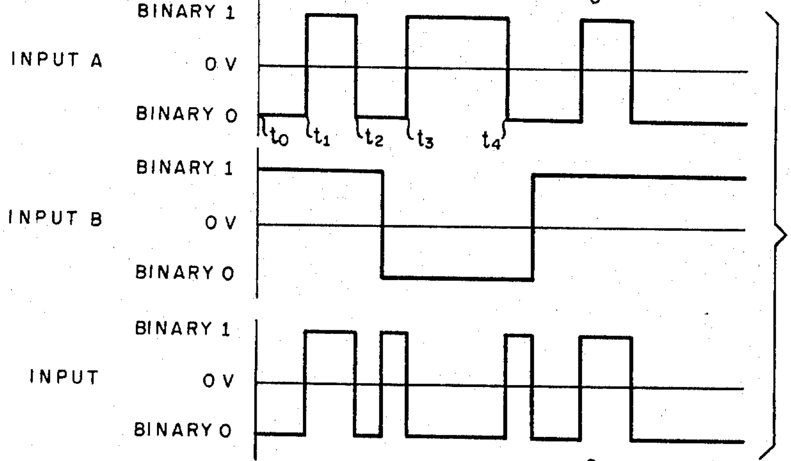
Figure 3:
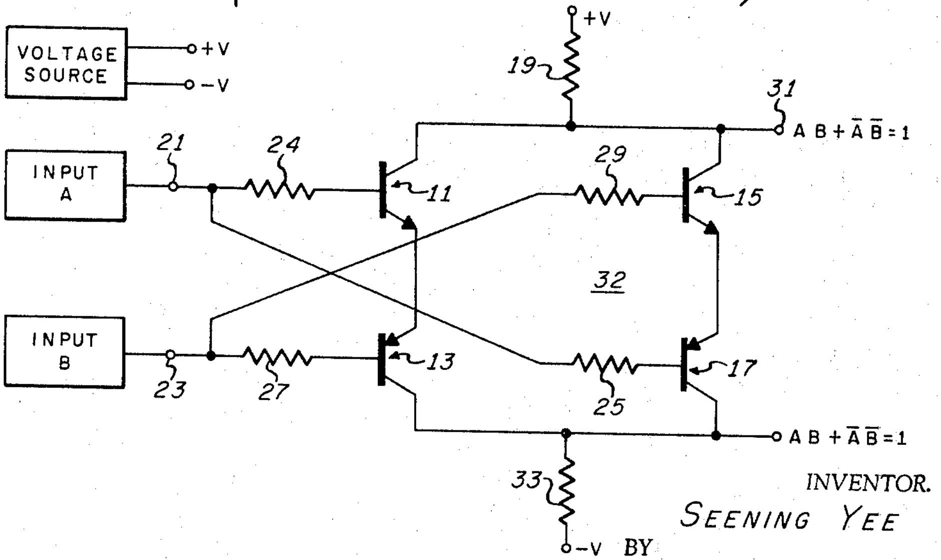

FIG. 1 is a circuit diagram of a presently preferred embodiment of the invention, FIG. 2 is a diagram of various wave shapes occurring during operation of the circuit of FIG. 1, FIG. 3 is a circuit diagram of an embodiment of the invention capable of supplying both coincidence and exclusive OR output signals.

Referring now to FIG. 1, a first pair of input transistors 11 and 13 are serially connected so that their emitter electrdoes are connected together. Similarly, a pair of output transistors 15 and 17 are serially connected so that their emitter electrodes are connected together. The transistor 11 and the transistor 13 are of the opposite conductivity types. In the presently preferred embodiment the transistor 11 is an NPN transistor whereas the transistor 13 is a PNP transistor. Similarly, the transistor 15 is an NPN transistor whereas the transistor 17 is a PNP transistor in this embodiment.

The collector electrodes of the transistors 11 and 15 are connected together and coupled to the positive terminal of a suitable voltage supply through a load resistor 19. The collector electrodes of the transistors 13 and 17 are each connected to the negative terminal of the voltage supply.

A first input terminal 21 receives a first train of input signals. A second input terminal 23 receives a second train of input signals. The signals from the terminal 21 are applied to the base electrode of the transistor 11 through a current limiting resistor 24 and to the base electrode of the transistor 17 through a current limiting resistor 25. Similarly, the input signals applied to the terminal 23 are applied to the base electrode of the transistor 13 through a current limiting resistor 27 and to the base electrode of the transistor 15 through a current limiting resistor 29.

It will be noted that the two input transistors 11 and 13 form a complementary pair. Similarly, the two output transistors 15 and 17 form a complementary pair. Furthermore, it will be noted that a given input signal is applied simultaneously to a pair of opposite conductivity type transistors.

An output terminal 31 is connected to the junction of the load resistor 19 and the transistor network 32.

The operation of a circuit employing the principles of the invention can be understood by referring to the diagrams of FIG. 2 together with the circuit diagram of FIG. 1.

Any one of the various signals is considered to represent a binary ONE when that signal has a positive polarity, and to represent a binary ZERO when that signal has a negative polarity.

Assume that operation of the circuit is begun at a time when a binary ONE signal is being applied to the terminal 23, and a binary ZERO is being applied to the input terminal 21 as depicted at time $t_0$ in FIG. 2. The positive input signal on the terminal 23 will drive the transistor 13 to cutoff and the transistor 15 to saturation.

The negative input signal on the terminal 21 will drive the transistor 11 to cutoff and the transistor 17 to saturation. Thus the input transistors 11 and 13 are cut off whereas the transistors 15 and 17 are both saturated. Current flow through the transistors 15 and 17 will provide a voltage drop through the load resistor 19 and maintain the output voltage at the terminal 31 at a voltage which is practically equal to the —V voltage of the voltage source. Thus while the input signals are of opposite polarity the circuit produces a binary ZERO output voltage. At time $t_1$ the polarity of the signal applied to the input terminal 21 reverses. This causes the transistor 11 to saturate and the transistor 17 to be cut off. Under these conditions, the transistor 13 remains cut off so that current can pass through neither the input branch nor the output branch of the transistor network. This interrupts the flow of current through the load resistor 19 and causes the voltage at the output terminal 31 to rise to the level of the +V voltage of the supply.

Under these circumstances a binary ONE input signal is being applied to both input terminals and a binary ONE output signal is being produced at the terminal 31.

At time $t_2$ the polarity of the voltage at input terminal 21 again reverses so that the circuit returns to its original condition and the output voltage returns to the binary ZERO condition.

At time $t_3$ a binary ZERO signal continues to be applied to the terminal 23 while a binary ONE signal is switched to the terminal 21. Under these conditions the signal at the terminal 21 drives the transistor 11 to saturation and the input signal on the terminal 23 drives the transistor 13 to saturation so that a load current passes through the load resistor 19 causing the output voltage to drop to a low level. It can thus be seen that a binary ZERO output voltage will be produced for either combination of unlike input signals.

Beginning at time $t_4$, binary ZERO input signals are applied to both terminals. These signals cut off the transistor 11 in the input branch and the transistor 15 in the output branch. Since one transistor in each branch is cut off under these conditions, no load current can flow and the output voltage rises to provide a binary ONE output signal. Thus it can be seen that like input signals of either polarity will produce a binary ONE output signal.

It will be seen that the output voltage rises to a level practically equal to the voltage on the positive terminal of the voltage source and falls to a voltage level practically equal to the voltage at the negative terminal of the source. Furthermore, since two transistors are connected in series in either branch of the network, a relatively large supply voltage can be used. During cut off, the total supply voltage is divided across two series transistors. Because a relatively large output voltage is available, the percentage variation in the output wave shape due to temperature changes and external factors is relatively small.

Since the output voltage swings between levels substantially equal to the voltage at the terminals of the supply, the output voltage can be made symmetrical with respect to ground.

The embodiment of the invention shown in FIG. 3 provides output signals representing the exclusive OR function as well as the coincidence function. This circuit is essentially the same as that of FIG. 1. However, a second load resistor 33 is connected between the negative terminal of the voltage supply and the collector electrodes of the PNP transistors, and a second output terminal 35 is provided to connect exclusive OR output signals to external apparatus.

The remaining elements in the circuit of FIG. 3 are designated by the same numerals as the corresponding elements in the circuit of FIG. 1.

It will be remembered that under the conditions depicted as time $t_0$ in FIG. 2, a binary ZERO signal was being applied to the terminal 21 and a binary ONE signal was being applied to the terminal 23. Under these conditions the input signal applied to the terminal 21 caused the transistor 17 to conduct and the input signal applied to the input terminal 23 caused the transistor 15 to conduct. Since conduction was then established through the output branch of the transistor circuit the voltage at the output terminal 31 dropped to a low value indicating a binary ZERO coincidence output. Under these same conditions the circuit of FIG. 3 would also experience a load current flowing through the output transistors. This load current would produce a binary ZERO coincidence voltage. However the same load current would also flow through the second load resistor 33 raising the voltage of the second output terminal 35 so as to provide a binary ONE exclusive OR signal.

In the same fashion it can be seen that a binary ONE input signal at the terminal 21 and a binary ZERO input signal at the terminal 23 will also provide a binary ONE exclusive OR output signal.

It will be appreciated that specific polarities and transistor types have been described. However opposite polarities and transistor types may be substituted so long as the complementary symmetry arrangement is maintained.

While the invention has been described in its preferred embodiments, it is to be understood that the words which have been used are words of description rather than of limitation and that changes within the purview of the appended claims may be made without departing from the true scope and spirit of the invention in its broader aspects.

In the claims:

1. A logic circuit comprising a source of voltage; first and second load resistors connected to the positive and negative terminals of said voltage source respectively; input and output NPN transistors having their collector electrodes connected directly to said first load resistor; input and output PNP transistors having their collector electrodes connected directly to the second load resistor; said input transistors further having their emitter electrodes connected together; said output transistors further having their emitter electrodes connected together; means to apply first bipolar input signals to the base of the input NPN transistor and the base of the output PNP transistor; means to apply second bipolar input signals to the base of the input PNP transistor and the base of the output NPN transistor; and first and second output terminals connected to the collector terminals of said NPN and said PNP transistors respectively.

2. In combination: first and second serially connected transistors; third and fourth serially connected transistors; said first and third transistors being of the same conductivity type; said second and fourth transistors being of the same conductivity type, but opposite to that of said first and third transistors; a source of voltage; a first series resistor connected to one terminal of said source of voltage; said first and said third transistors having their collector electrodes connected to said first series resistor; a second series resistor connected to the second terminal of said voltage source; said second and said fourth transistors having their collector electrodes connected to said second series resistor; a first input signal means connected to the base electrodes of said first transistor and to the base electrode of said fourth transistor; a second signal input means connected to the base electrode of said second transistor and the base electrode of said third transistor; a first output terminal connected to the collector electrodes of said first and said third transistors; and a second output terminal connected to the collector electrodes of said second and said fourth transistors.

References Cited

UNITED STATES PATENTS 3,033,995 5/1962 Putzrath ---------- 307—88.5

ARTHUR GAUSS, *Primary Examiner.*

DONALD D. FORRER, *Assistant Examiner.*